United States Patent
Grant et al.

(10) Patent No.: US 9,695,520 B2
(45) Date of Patent: *Jul. 4, 2017

(54) ARRANGEMENT FOR MEASURING ELECTRIC CURRENT IN AN INDIVIDUAL ELECTRODE IN AN ELECTROLYSIS SYSTEM

(71) Applicant: Outotec (Finland) Oy, Espoo (FI)

(72) Inventors: Duncan Grant, Bristol (GB); Michael H. Barker, Pori (FI); Lauri Nordlund, Espoo (FI); Ari Rantala, Porvoo (FI); Henri K. Virtanen, Pori (FI)

(73) Assignee: Outotec (Finland) Oy, Espoo (FI)

( * ) Notice: Subject to any disclaimer, the term of this patent is extended or adjusted under 35 U.S.C. 154(b) by 78 days.

This patent is subject to a terminal disclaimer.

(21) Appl. No.: 14/769,437

(22) PCT Filed: Feb. 27, 2014

(86) PCT No.: PCT/FI2014/050145
§ 371 (c)(1),
(2) Date: Aug. 20, 2015

(87) PCT Pub. No.: WO2014/131946
PCT Pub. Date: Sep. 4, 2014

(65) Prior Publication Data
US 2016/0002801 A1   Jan. 7, 2016

(30) Foreign Application Priority Data

Mar. 1, 2013   (FI) .................................... 20135196

(51) Int. Cl.
*G01R 31/02*   (2006.01)
*C25C 7/06*   (2006.01)
(Continued)

(52) U.S. Cl.
CPC .................. *C25C 7/06* (2013.01); *C25C 1/12* (2013.01); *C25C 7/00* (2013.01); *G01R 15/202* (2013.01); *G01R 31/025* (2013.01)

(58) Field of Classification Search
USPC .............. 324/439, 444, 453, 463; 204/228.1, 204/229.8
See application file for complete search history.

(56) References Cited

U.S. PATENT DOCUMENTS 6,136,177 A   10/2000 Hung
6,631,818 B1   10/2003 Ito
(Continued)

FOREIGN PATENT DOCUMENTS

CL   2219-2007   1/2008
JP   03-18765 A   1/1991
(Continued)

OTHER PUBLICATIONS

PCT, International Search Report for International Application No. PCT/FI2014/050145, International Filing Date: Feb. 27, 2014 (Feb. 27, 2014), pp. 6.
(Continued)

*Primary Examiner* — Vincent Q Nguyen
(74) *Attorney, Agent, or Firm* — Chernoff Vilhauer LLP

(57) ABSTRACT

The invention relates to a method and current measuring arrangement for measuring electric current flowing in an individual electrode in an electrolysis system. The electrolysis system comprises a plurality of interleaved electrodes (1, 2), cathodes (1) and anodes (2), arranged in an electrolysis cell (3) and immersed in electrolyte, said electrolysis system having a busbar (4) disposed on a separating cell wall (5) between each of the two adjacent cells to conduct electric current to the electrodes via a contact point (6) between the busbar and a hanger bar (7) of the electrode, and the current (Continued)

sensing arrangement comprises a magnetic field sensing means (8; 8¹, 8²; 10) for measuring the magnetic field induced by said current. The magnetic field sensing means (8; 8¹, 8²; 10) are arranged to sense the magnetic field substantially at the level of the contact point (6).

17 Claims, 10 Drawing Sheets

(51) Int. Cl.
    *C25C 1/12*     (2006.01)
    *C25C 7/00*     (2006.01)
    *G01R 15/20*     (2006.01)

(56) References Cited

U.S. PATENT DOCUMENTS

| | | |
|---|---|---|
| 7,445,696 B2 | 11/2008 | You et al. |
| 8,142,627 B2 | 3/2012 | Vidaurre Heiremans |
| 2004/0000485 A1 | 1/2004 | Preusse et al. |
| 2005/0053814 A1* | 3/2005 | Imamura ............. B60L 11/1881 429/413 |
| 2010/0258435 A1 | 10/2010 | Vidaure Heiremans |
| 2014/0209455 A1* | 7/2014 | Prado ........................ C25C 7/00 204/229.8 |

FOREIGN PATENT DOCUMENTS

| | | |
|---|---|---|
| JP | 10-245690 A | 9/1998 |
| JP | 3925983 B2 | 6/2007 |
| WO | 2009016190 A2 | 2/2009 |
| WO | 2011123896 A1 | 10/2011 |
| WO | 2012020243 | 2/2012 |
| WO | 2012020243 A1 | 2/2012 |
| WO | 2013037899 | 3/2013 |
| WO | 2014032085 | 3/2014 |

OTHER PUBLICATIONS

European Patent Office, Extended European Search Report issued in application No. 14757596.3, Jul. 7, 2016, European Patent Office, Munich, Germany.

Office Action prepared by the Chilean Patent Office for CL2015-002408, dated Oct. 18, 2016, 9 pages.

Notification of Reason for Refusal prepared by the Japanese Patent Office for JP 2015-559533, dated Nov. 16, 2016, 10 pages.

* cited by examiner

⊕ unidirectional flow of current (into page)
⊙ unidirectional flow of current (out of page)

ARRANGEMENT FOR MEASURING ELECTRIC CURRENT IN AN INDIVIDUAL ELECTRODE IN AN ELECTROLYSIS SYSTEM

CROSS-REFERENCE TO RELATED APPLICATIONS

This is a national stage application filed under 35 USC 371 based on International Application No. PCT/FI2014/050145 filed Feb. 27, 2014 and claims priority under 35 USC 119 of Finnish Patent Application No. 20135196 filed Mar. 1, 2013.

STATEMENT REGARDING FEDERALLY SPONSORED RESEARCH OR DEVELOPMENT

Not Applicable.

THE NAMES OF THE PARTIES TO A JOINT RESEARCH AGREEMENT

Not Applicable.

INCORPORATION-BY-REFERENCE OF MATERIAL SUBMITTED ON A COMPACT DISC OR AS A TEXT FILE VIA THE OFFICE ELECTRONIC FILING SYSTEM (EFS-WEB)

Not Applicable.

STATEMENT REGARDING PRIOR DISCLOSURES BY THE INVENTOR OR A JOINT INVENTOR

Not Applicable.

FIELD OF THE INVENTION

The present invention relates to a method of measuring electric current flowing in an individual electrode in an electrolysis system. Further, the invention relates to a current measuring arrangement for measuring electric current flowing in an individual electrode in an electrolysis system.

BACKGROUND OF THE INVENTION

In electrorefining (ER) and electrowinning (EW) electrodes are immersed in an electrolyte and an electric current is passed between them. The anode is made positive and the cathode made negative so that an electric current passes through the electrolyte from anode to cathode.

In electrorefining (ER), the metal anode is soluble. That is to say that the metal enters into the electrolyte under the influence of the potential between the anode and cathode. For example, in the electrorefining of copper, the anode is made of impure metallic copper and copper ions enter the electrolyte from the anode. The copper ions, now in the electrolyte, are transported through or by the electrolyte to the cathode where they are deposited. The cathode may be of the same metal as the metal that is being deposited or it may be of a different metal. For example, in the electrorefining of copper it was at one time common to employ a cathode made of copper. However, a stainless steel permanent cathode is now commonly employed which quickly becomes coated with copper and which from then on essentially performs as a copper cathode. The deposited copper is mechanically removed or stripped from the permanent cathode and the permanent cathode reused. The copper deposited on the cathode is highly pure. Impurities that were in the impure anode may dissolve into the electrolyte or fall out as a solid as the anode is dissolved and may contain useful byproducts, for example, gold. Besides copper, metals purified by ER include gold, silver, lead, cobalt, nickel, tin and other metals.

Electrowinning (EW) differs from electrorefining in that the metal sought is imported into the cells and is already contained within the electrolyte. In the example of copper, sulphuric acid is typically employed to dissolve copper from an oxide form of copper ore and the resulting liquor, after concentration, is imported into an electrowinning cell to have the copper extracted. An anode and cathode are immersed in the electrolyte and a current is passed between them, again with the anode being positive and the cathode being negative. In electrowinning, the anode is not soluble but is made of an inert material. Typically a lead alloy anode is used in the case of copper electrowinning. The cathode may be of the same metal that is being extracted from the electrolyte or it may be of a different material. For example, in the case of copper, copper cathodes may be used although stainless steel cathodes are commonly employed which quickly become coated in copper. Under of the influence of an electric current, the metal to be won leaves the electrolyte solution and is deposited in a very pure form on the cathode. The electrolyte is circulated and concentrated by this process having given up a large proportion of its metal content. Besides copper, metals obtained by electrowinning include lead, gold, silver, zinc, chromium, cobalt, manganese, aluminium and other metals. For some metals, such as aluminium, the electrolyte is a molten material rather than an aqueous solution.

As an example of the voltages and current involved, in copper refining, the cell voltage is generally about 0.3V and in copper electrowinning is about 2.0V. In both cases the cathodic current density is about 300 A/m² and the area of each side of the cathode at present is about 1 m². These figures differ considerably for different metals and widely varying current densities may be used for the same metal but the invention applies to the electrorefining and electrowinning of all metals.

In ER and EW the starting point is an anode juxtaposed to a cathode in an electrolyte contained in a tank. But many cathode plates and many anode plates may be used, interleaved, with all the anode plates connected in parallel and all the cathode plates connected in parallel contained within a single tank of electrolyte. Electrically this still looks like a single cell and in the industry it is therefore commonly called a cell. In the ER and EW industry, "cell" is almost universally used to mean a tank filled with anodes and cathodes in parallel. In the ER and EW industry, "tank" can mean the same as "cell", above, or it can mean the vessel alone, depending on the context. In tankhouses cells are connected electrically in series. A typical ER tankhouse might therefore require an electrical supply of the order of 36,000 Amps at 200 Volts.

The electrical circuit representing a typical tankhouse is shown in FIG. 1. Tanks 3, each containing one cell (composed of many cathodes 1 in parallel and many anodes 2 in parallel), are connected in series. A DC voltage source 19 is connected across the series circuit to drive the desired current through the cells 3. The total current is maintained at a desired value. Ideally, the current should divide equally between the cathodes 1. In practice, there is significant variation in the resistance of each cathode-anode current path and hence there are variations in the values of the individual cathode currents. This means in practice that the metal production process operates at below optimum efficiency.

More seriously, there is sometimes disruption to the operation of part of the cell when a short circuit develops between an anode plate and a cathode plate. This is typically due to a nodule or dendrite of metal growing from a cathode plate and increasing in size until it connects with the adjacent anode plate. The nodule of metal has to be physically removed to permit normal operation to continue.

Another disruption to normal production can occur when an individual cathode or individual anode becomes disconnected from the electrical circuit. As FIG. 2 shows, the electrical connection to cathodes 1 and to anodes 2 is typically made through lugs or hanger bars 7 which project from each side of the electrodes. On the right side, the hanger bar 7 rests on a busbar 4 which forms part of the electrical circuit. The disconnection is typically caused by corrosion or burning of the contact point 6 or by a foreign obstacle becoming jammed between the hanger bar 7 and the busbar 4 or build up of sulfate between the hanger bar 7 and the busbar. On the left side, the other hanger bar 7' may either rest on an insulated supporting bar 4' or this bar may be a secondary busbar, also known as an equaliser bar, so that the electrode 1 is electrically connected through two paths so as to reduce the effect of a bad contact to one of the hanger bars 4.

A short circuit results in an unusually large amount of current flowing in the cathode 1 and the anode 2 which are electrically shorted together. Methods conventionally employed to detect short circuits are less than ideal. One method is to detect the overheating of the electrodes resulting from the short circuit. This is less than satisfactory because damage to the electrode, its hanger bars 7 or the busbar 4 may have resulted due to a time delay before the short is detected.

This method will become even less acceptable as new, expensive, high-performance anodes, are introduced into electrowinning processes. In electrowinning, inert lead anodes have been commonly used. In recent years mixed metal oxide (MMO) catalytically coated titanium anodes have been increasingly adopted because of their superior properties. However, the MMO coated titanium anodes are more expensive than lead based anodes and more easily damaged by the heat generated during shorting. It has therefore become imperative that problems with the process, in particular short circuits between electrodes, are identified very quickly. Furthermore it is desirable that circumstances likely to give rise to a short circuit are identified. One indicator of an incipient short circuit is a rise in cathode or anode current above its usual value. Hence current measurement with an accuracy and resolution suitable for detecting this rise in current is a tool for identifying dangerous situations and for prompting operator action to correct the situation.

Another method of detecting shorts is to have a worker patrol the tanks using a Gaussmeter to detect the high magnetic field produced by the short-circuit current. Due to restricted labour the patrol can often be organized only once per day or a maximum of few times per day. Therefore the short may go undetected for many hours, during which time production is lost, current efficiency decreases, risk of decreased cathode quality increases and the electrodes, hanger bars and busbars may be damaged. This method has also proved very inefficient because the patrol needs to check every cell including the cells that do not have any problems. Unnecessary walking on top the cells during the patrol may also cause electrode movement and thus new short circuits. It also increases the risk of accidents. Infrared cameras are also used either by the worker patrols or in overhead cranes to detect short circuits due to heat caused by high current. The method has often proved not to give the desired results in the tankhouse environment because of the long time delay in detecting a short and also availability issues of a crane for the monitoring task.

In order to detect short circuits and bad (open) contacts there is a need to detect these problems at the level of individual cathodes or anodes by providing methods for measuring the current flowing in individual electrodes.

In prior art, U.S. Pat. No. 7,445,696 discloses an electrolytic cell current monitoring device and method, which detects not only short circuits, but open circuits as well. The apparatus comprises magnetic field sensors, e.g. Hall effect sensors, that measure magnetic field strength generated around a conductor adapted to carry electrical current to or from an electrolytic cell. The magnetic field current sensors for each cathode may be arranged on a rail car device which operates above the cells to detect the shorts and open contacts. Detection of current in all cathodes in the cell can be made simultaneously. The magnetic field sensor is brought at a distance above each electrode hanger bar aided by a capacitive proximity sensor. Further prior art is disclosed in an article "Measurement of Cathodic Currents in Equipotential Inter-Cell Bars for Copper Electrowinning and Electrorefining Plants". Industry Applications Conference, 2007. 42nd IAS Annual Meeting. Conference Record of the 2007 IEEE; 23-27 Sep. 2007; Wiechmann, E. P., Morales, A. S.; Aqueveque, P. E.; Burgos, R. P. pp. 2074-2079, proposes a measurement technique for the cathodic currents in a dog-bone type intercell bars using linear ratiometric Hall effect sensors and ferromagnetic flux concentrators. The article discloses that cathode currents may be measured by combining the magnetic flux sensors and flux concentrators.

Prior art arrangements for measuring the cathode or anode bar currents have employed Hall effect sensors in proximity to the electrode hanger bars or interconnectors between anodes and cathodes to sense the magnetic field generated by these currents, thereby obtaining a signal proportional to the currents. However, other current carrying conductors are usually in close proximity to the Hall effect sensors and the magnetic field they produce causes inaccuracy in the current measurement. The use of pieces of magnetic material attached to the Hall effect sensor to concentrate flux through the sensor (as that disclosed in the above-mentioned article "Measurement of Cathodic Currents . . . ." by Wiechmann et al.), may also channel unwanted flux through the sensor.

In short, the problem with the prior art methods and arrangements is that they do not provide sufficiently accurate measurement results of the electric current at the point of maximum current. The maximum current occurs at the contact point where the electrode hanger bar contacts the electric busbar. Further, the known methods, which measure the current from the electrode hanger bar from a distance above or underneath the hanger bar, are very susceptible to differences in the position of the hanger bar in the direction of the busbar in relation to the position of the magnetic field sensor. Also they have proved vulnerable to significant measurement errors due to magnetic fields generated by adjacent cathodes. Therefore, the measurement accuracy obtained by prior art methods is bad and insufficient.

BRIEF SUMMARY OF THE INVENTION

The objective of the invention is to eliminate the disadvantages mentioned above.

In particular, it is an objective of the present invention to provide a method and arrangement which is able to measure accurately the current passing through the contact point of the electrode hanger bar and the electrical busbar.

Further, the objective of the invention is to provide method and arrangement for measuring the current entering or leaving the electrodes (cathodes and/or anodes) which will permit operators to detect early the presence of short circuits or open circuits.

Further, the objective of the invention is to provide method and arrangement, which enable, due to the sufficiently accurate current measurement, that the growth of the metal nodules or dendrites which lead to a short circuit may be detected before the short circuit occurs, allowing action to be taken to prevent a short occurring.

Further, the objective of the invention is to provide method and arrangement, which enable, due to the sufficiently accurate current measurement, that high resistance contacts (between the hanger bar contacts and their respective busbars) can be identified and early corrective action can be taken.

Further, the objective of the invention is to provide method and arrangement which enable, due to the sufficiently accurate current measurement, that the measurement can be of use for process control, either through real time adjustment of current flow or by improvements in plant operation resulting from analysis of the data.

Further, the objective of the invention is to provide method and arrangement, which, due to the sufficiently accurate current measurement, permits process analysis, and if required, dynamic process control, as well as the detection of incipient short circuits and actual short circuits and the detection of open circuits.

The Table 1 below shows the estimated current measurement accuracy required for the various objectives mentioned above. This invention aims to make current measurements of the highest accuracy thereby permitting process analysis, and if required, dynamic process control, as well as the detection of incipient short circuits and actual short circuits and the detection of open circuits.

TABLE 1

| Objective | Accuracy Required |
| --- | --- |
| Process analysis and control | Between 1% and 5% |
| Detection of hanger bar contact deterioration | 10% or better |
| Detection of incipient short circuits | 25% or better |
| Detection of short circuits or open circuits | 50% or better |

According to a first aspect, the present invention provides a method of measuring electric current flowing in an individual electrode in an electrolysis system comprising a plurality of interleaved electrodes, cathodes and anodes, arranged in an electrolysis cell and immersed in electrolyte, said electrolysis system having a busbar disposed on a separating cell wall between each of the two adjacent cells to conduct electric current to the electrodes via a contact point between the busbar and a hanger bar of the electrode, and in which method the electric current of each electrode is measured by measuring the magnetic field induced by said current. "The contact point" is the site where the hanger bar makes contact with the respective busbar element. According to the invention the magnetic field is sensed substantially at the level of the contact point.

According to a second aspect, the present invention provides a current measuring arrangement for measuring electric current flowing in an individual electrode in an electrolysis system comprising a plurality of interleaved electrodes, cathodes and anodes, arranged in an electrolysis cell and immersed in an electrolyte, said electrolysis system having a busbar disposed on a separating cell wall between each of the two adjacent cells to conduct electric current to the electrodes via a contact point between the busbar and a hanger bar of the electrode, and the current sensing arrangement comprises a magnetic field sensing means for measuring the magnetic field induced by said current. According to the invention the magnetic field sensing means are arranged to sense the magnetic field substantially at the level of the contact point.

The advantage of the invention is that very accurate measurement results of the current passing via the contact points can be obtained for the detection of short circuits, incipient short circuits, open circuits and incipient open circuits. This permits operators to take an early corrective action before any damage occurs. The invention may be fitted during construction of new ER and EW plants, or retrofitted to an existing ER or EW plant. A further advantage of the invention is to identify to operators the exact location of a fault or incipient fault thereby eliminating the need for operator patrols which are wasteful of labour and potentially damaging to the cells.

In an embodiment of the method, the magnetic field is sensed with a magnetic circuit being arranged to encircle the contact point substantially in a horizontal plane at the level of the contact point.

In an embodiment of the method, the magnetic circuit is an open loop current sensor.

In an embodiment of the method, the magnetic circuit is a closed loop current sensor.

In an embodiment of the method, the magnetic circuit comprises a core of magnetic material formed as a first ring surrounding the contact point, said ring being placed in recesses formed in the busbar.

In an embodiment of the method, the magnetic circuit is a core of magnetic material formed as a second ring surrounding the contact point and being bent, folded or formed in two or three dimensions to fit over the busbar profile.

In an embodiment of the method, the magnetic field is sensed with a magnetic field sensor arranged in the vicinity of the contact point and in the horizontal plane. For fabrication reasons, the sensor may need to be located a 3D coordinate above the horizontal plane of the contact point. Such a location may be less than optimum for measurement signal, but more practical for physically positioning a sensor, i.e. a position which is already not occupied by other equipment typically present on the top of an EW cell including for example busbar, hanger bars, insulators, electrode lifting hooks or other cell top furniture and will vary from tankhouse to tankhouse. The angle of the sensor to the horizontal plane of the contact point may then be in the range of 0 to 75°. 0 degrees means that the sensor is in the same plane as the contact point, 75 degrees means almost directly above the contact point.

In an embodiment of the method, the magnetic field is sensed with an array of magnetic field sensors arranged in three dimensional space around the contact point substantially in the horizontal plane of the contact point, but also at an angle in the range 0 to 75°.

In an embodiment of the method, the magnetic field is sensed with an array of magnetic field sensors arranged around the contact point substantially in the horizontal plane of the contact point.

In an embodiment of the method, a frame unit of insulating, non-magnetic material is arranged to hold the magnetic field sensor(s) in a predetermined position in three dimensional space with respect to the contact point.

In an embodiment of the method, the magnetic field sensors are Hall effect sensors and/or flux-gate type current sensors.

In an embodiment of the arrangement, the magnetic field sensing means comprise a magnetic circuit arranged to encircle the contact point substantially in the horizontal plane which is at the level of the contact point.

In an embodiment of the arrangement, the magnetic circuit is an open loop current sensor.

In an embodiment of the arrangement, the magnetic circuit is a closed loop current sensor.

In an embodiment of the arrangement, the magnetic circuit comprises a core of magnetic material formed as a first ring surrounding the contact point, said ring being placed in recesses formed in the busbar.

In an embodiment of the arrangement, the magnetic circuit is a core of magnetic material formed as a second ring surrounding the contact point and being bent or folded in two or three dimensions over the busbar.

In an embodiment of the arrangement, the magnetic field sensing comprises a magnetic field sensor arranged in the vicinity of the contact point.

In an embodiment of the arrangement, the arrangement comprises an array of magnetic field sensors arranged around the contact point substantially in a plane of the contact point.

In an embodiment of the arrangement, the array of magnetic field sensors is arranged in a three dimensional space around the contact point substantially in the plane of the contact point at an angle in the range 0 to 75° with respect to horizontal.

In an embodiment of the arrangement, the arrangement comprises an array of magnetic field sensors arranged around the contact point substantially in the horizontal plane at the level of the contact point.

In an embodiment of the arrangement, the arrangement comprises a frame unit of insulating, non-magnetic material to hold the magnetic field sensors in a predetermined position with respect to the contact point.

In an embodiment of the arrangement, the frame unit comprises a plurality of magnetic field sensors arranged to measure magnetic field from a plurality of contact points.

In an embodiment of the arrangement, the frame unit comprises one or more notches, each of said notches being arranged to accommodate an end of an electrode hanger bar.

In an embodiment of the arrangement, the frame unit comprises one or more notches for one or more hanger bars of cathodes.

In an embodiment of the arrangement, the frame unit comprises one or more notches for one or more hanger bars of anodes.

In an embodiment of the arrangement, each notch is arranged to accommodate an end of a hanger bar with a play to allow installing of the frame unit by dropping it into position on the busbar without having to remove the electrodes and to allow lifting the electrodes without having to remove the frame.

In an embodiment of the arrangement, each notch is defined between two walls which are parallel and opposite and at a distance from each other.

In an embodiment of the arrangement, two magnetic field sensors, which are spaced from each other, are attached to each of the walls.

In an embodiment of the arrangement, the frame unit comprises notches for a number of hanger bars of cathodes and for a number of hanger bars of anodes.

In an embodiment of the arrangement, the arrangement comprises a plurality of frame units arranged in a queue or row on the busbar.

In an embodiment of the arrangement, the frame unit comprises a microprocessor for pre-analysis of the plurality of signals derived from the magnetic field sensors.

In an embodiment of the arrangement, the frame unit microprocessors connect and exchange information by digital, analog or wireless means.

In an embodiment of the arrangement, the frame unit microprocessors connect and exchange information with a host microprocessor by digital, analog or wireless means.

In an embodiment of the arrangement, the frame unit comprises visual indicators which are arranged to indicate which electrodes have a problem associated with them which requires attention of the tankhouse operators.

In an embodiment of the arrangement, the visual indicators are controlled by the microprocessor which is arranged within the frame unit.

In an embodiment of the arrangement, the microprocessor is arranged to detect failure of a magnetic field sensor and to reorganize its analysis of the remaining magnetic field sensor signal so that the frame unit can continue to function.

In an embodiment of the arrangement, the microprocessor is arranged to provide a warning signal of the failure of a magnetic field sensor.

In an embodiment of the arrangement, the arrangement comprises a central processing unit arranged to receive signals from the microprocessors of the frame units.

In an embodiment of the arrangement, the frame unit comprises temperature sensors arranged to measure the temperature of the electrode hanger bars.

In an embodiment of the arrangement, the frame unit comprises temperature sensors arranged to measure the temperature of the bus bar.

In an embodiment of the arrangement, the frame unit is powered by external unit or host.

In an embodiment of the arrangement, the frame unit comprises an electrical energy storage device.

In an embodiment of the arrangement, the energy storage is chargeable by energy harvesting from the ambient.

In an embodiment of the arrangement, the magnetic field sensors are Hall effect sensors and/or flux-gate type current sensors.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention. In the drawings.

DETAILED DESCRIPTION OF THE INVENTION

Figure 1:
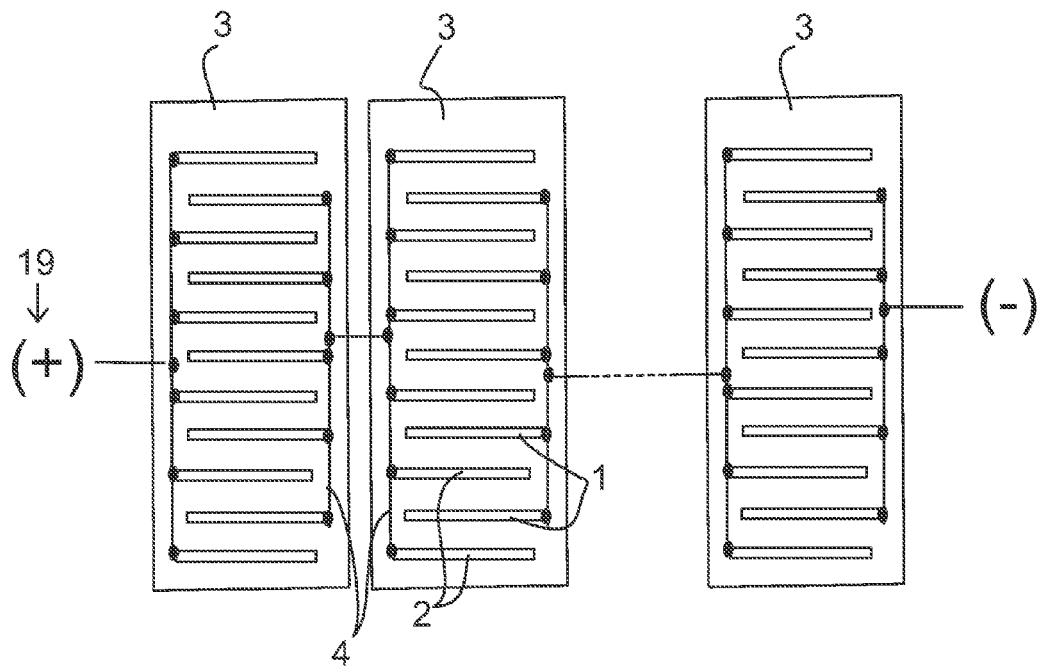
FIG. 1 is a schematic representation of the electrical circuit of a tankhouse.
Figure 2:
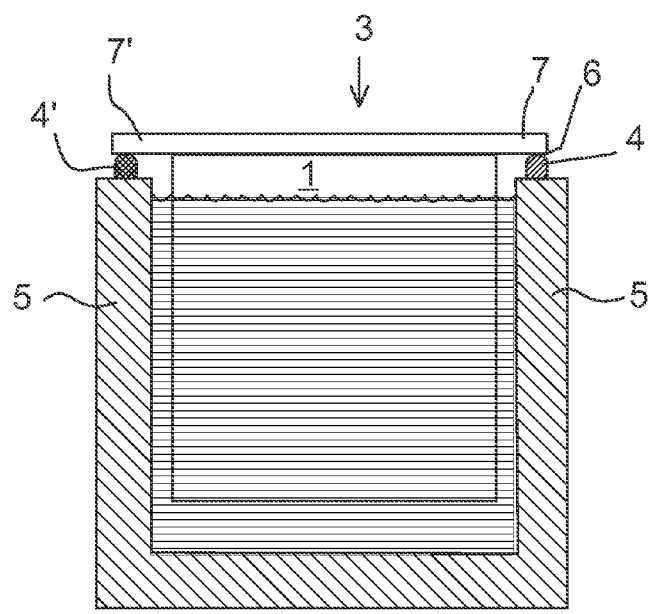
FIG. 2 is a cross-section of an electrolysis cell with an electrode immersed in electrolyte.

In one embodiment of the invention, as also shown in FIGS. 5 to 8, the magnetic field is sensed at the level of the contact point 6 between a hanger bar 7 of an electrode 1 and/or 2 and the busbar 4 with a magnetic circuit 8; $8^1$, $8^2$ which is arranged to encircle the contact point 6 substantially in a horizontal plane substantially at the level of the contact point. The magnetic circuit may be used as an open loop current sensor or as a closed loop current sensor. This permits accurate measurements to be made on electrode currents.

Figure 3:
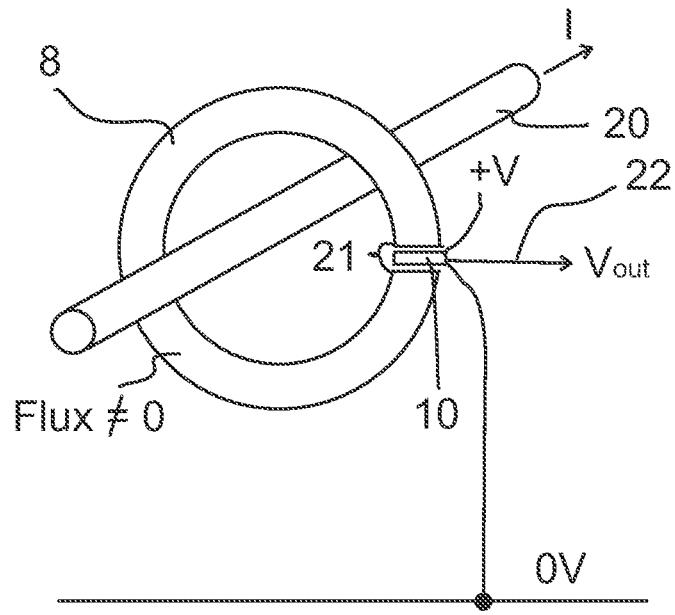
FIG. 3 is a schematic illustration of an open loop current sensor.

FIG. 3 shows the well-known principle of an open loop magnetic circuit for current measurement. In this sensor the current-carrying conductor 20 passes through a magnetic circuit 8. The current I in the conductor 20 creates a magnetic flux in the magnetic circuit 8 which is proportional to the current in the conductor 20. The magnetic flux density in a gap 21 in the magnetic circuit 8 is measured by a Hall effect magnetic field sensor 10. The sensor 10 outputs a signal 22 which is proportional to the magnetic flux density in the gap 21 and hence to the current in the conductor 20.

Figure 4:
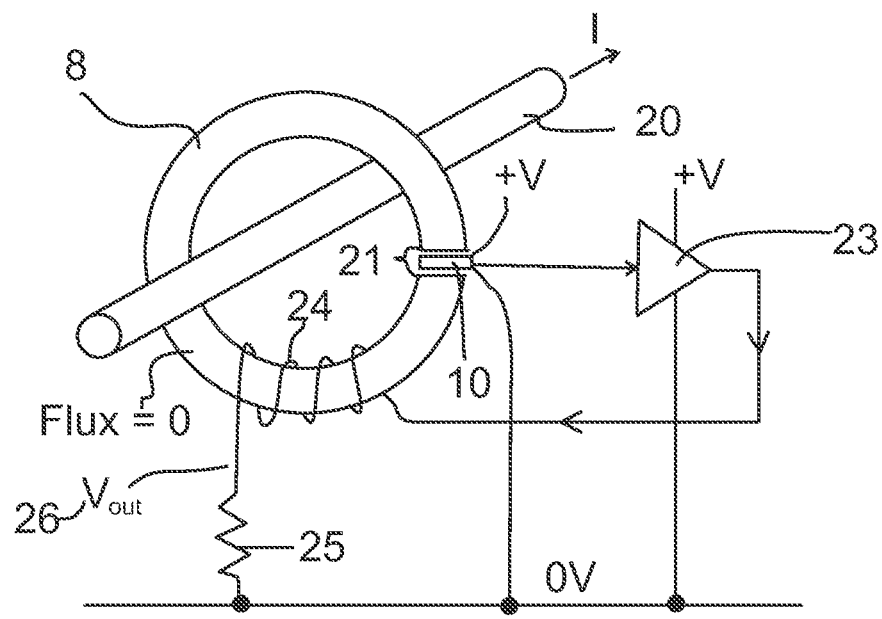
FIG. 4 is a schematic illustration of a closed loop current sensor.

FIG. 4 shows the well-known principle of a closed loop magnetic circuit for current measurement. In this sensor the current-carrying conductor 20 passes through a magnetic circuit 8. The current in the conductor 20 tends to create a magnetic flux in the magnetic circuit 8. This tends to alter the magnetic flux density in a gap 21. The output of the Hall effect sensor 10 in the gap 21 outputs a signal as a result of this change in flux density in the gap 21. This signal is amplified by amplifier 23 which supplies current to the coil 24 in such a sense that its Ampere-turn contribution to the magnetization of the magnetic circuit 8 opposes the Ampere-Turn contribution of the current in conductor 20 to the magnetization of the magnetic core 8. A balance is established between these competing Ampere-turns so that the flux in the core 8 remains close to zero. The current in the coil 24 passes through a resistor 25 to generate an output voltage signal 26 which is proportional to the current in coil 24 and also proportional to the current in the conductor 20.

Figure 5:
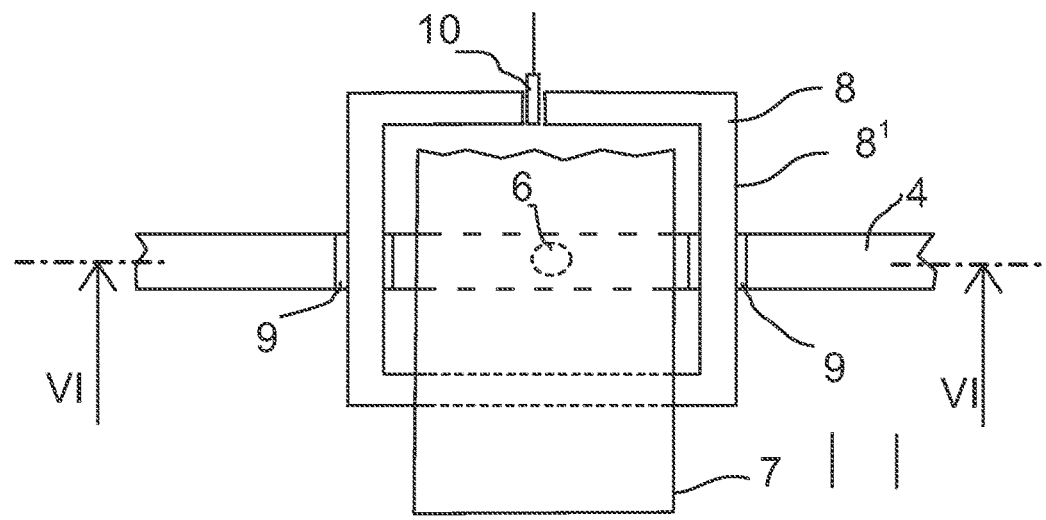
FIG. 5 shows a top view of a single-plane rigid current sensor (open loop or closed loop) fitted around a busbar—hanger bar contact point with recesses cut in the busbar to accommodate the sensor.
Figure 6:
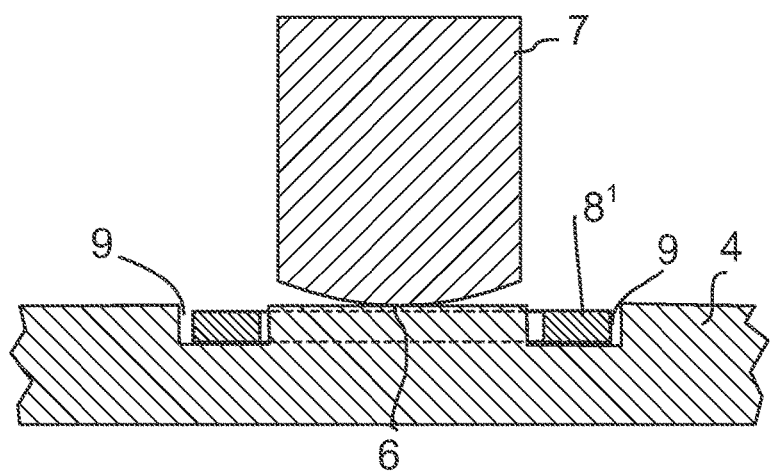
FIG. 6 shows a cross-section VI-VI from FIG. 5.

FIGS. 5 and 6 show a typical cathode or anode hanger bar 7 resting on a busbar 4 from which it obtains current or into which it delivers current. In some instances, current flow at the contact points will be unidirectional and in some other instances it will be bidirectional (for example in double-contact busbar systems, see also FIGS. 15 and 16). Since the bottom of the hanger bar 7 is often curved and the top of the busbar 4 is often curved, current flows through a contact point 6 between the two. If either the hanger bar 7 is flat-bottomed the contact point 6 is likely to be elongated. A magnetic circuit 8, which in this embodiment is a rectangular core of magnetic material formed as a first ring $8^1$, encircles the contact point 6. Since the magnetic circuit $8^1$ is rigid and essentially two-dimensional (i.e. flat), recesses 9 have been cut in the busbar 4 to accommodate the magnetic circuit ring $8^1$ to enable the magnetic field to be sensed at the level of the contact point 6. The arrangement of the magnetic circuit of FIGS. 5 and 6 is suitable to be installed during construction of new ER and EW plant.

Figure 7:
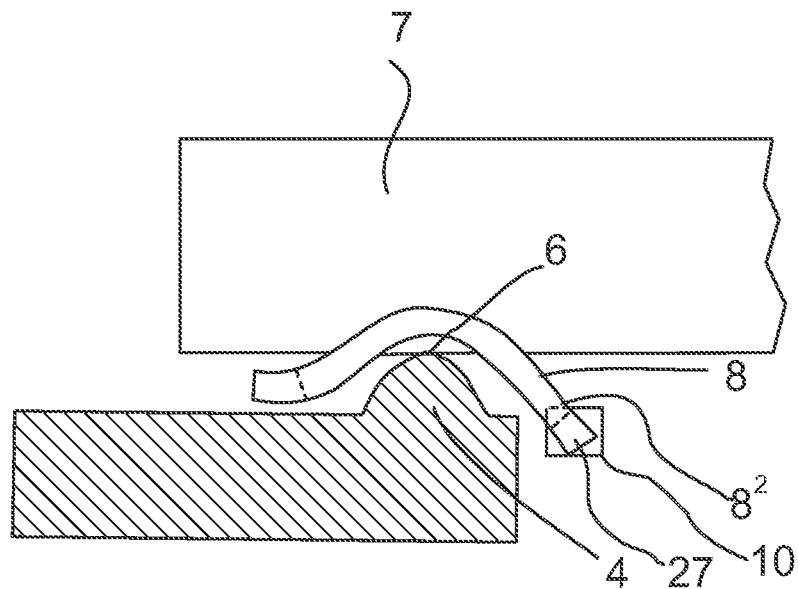
FIG. 7 shows how an open loop or closed loop current sensor which comprises a core bent in a third dimension to permit it to be fitted around a contact point without cutting of the busbar or the electrode hanger bar.
Figure 8:
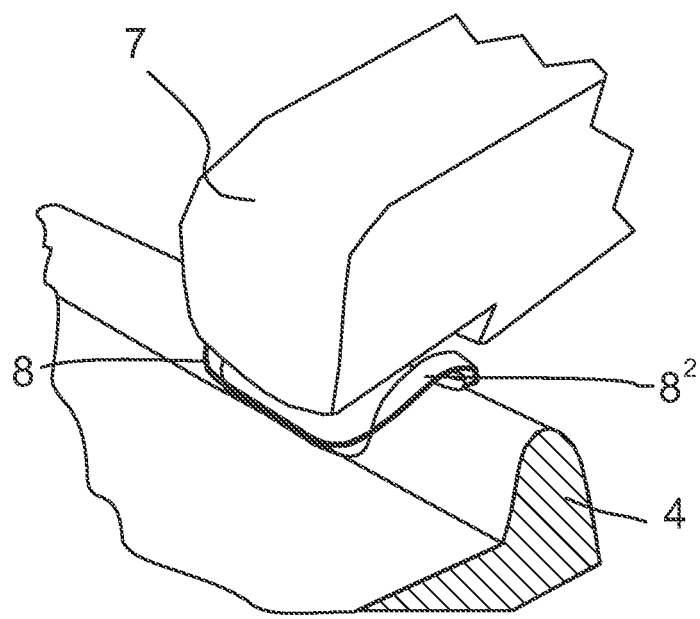
FIG. 8 shows how an open loop or closed loop current sensor which comprises a core bent and twisted to permit it to be fitted around a contact point without cutting of the busbar or the electrode hanger bar.

FIG. 7 shows the arrangement described in FIG. 6 but with a magnetic circuit 8 which a core of magnetic material formed as a second ring $8^2$ which is three-dimensionally bent, folded or formed to curve over the busbar 4. Thereby it is possible to avoid cutting recesses in the bus bar 4. FIG. 8 shows how the second ring core of the magnetic circuit $8^2$ may be twisted as well as bent to obtain a more convenient shape when the magnetic circuit is extended beyond the hanger bar 7. The embodiments of FIGS. 7 and 8 are important when retrofitting to an existing ER or EW plant is the objective. In an existing electrorefining plant the magnetic circuit of FIG. 7 or 8 may be fitted when the cathodes are harvested or the anodes changed or during cell cleaning. In existing electrowinning plant the magnetic circuits may be fitted when cathodes are harvested. Furthermore, the facility to bend the magnetic circuit $8^2$ in three dimensions affords the opportunity to locate the limb 27, which contains the magnetic flux sensor 10, in a position where it is unlikely to collect magnetic flux created by electric currents other than the current passing through the contact point 6 which is measured.

With respect to open loop and closed loop sensors, when selecting the position of the sensor gap, one should realize that magnetic flux generated by current other than that to be measured should be encouraged to pass through parts of the sensor magnetic which do not include the gap containing the Hall effect (or other) sensor. Also the gap in the magnetic circuit containing the Hall effect sensor (or other) should be located in a part of the magnetic circuit which is not prone to carrying magnetic flux generated by currents other than the one to be measured. Further, it is desirable that the Hall effect sensor (or other) to be located as far away as possible from sources of heat.

Further, with respect to open loop and closed loop sensors, when selecting the type of sensor to put in the gap of the magnetic circuit, one should realize that that there are also other options for the sensor in the magnetic circuit gap other than Hall effect sensors—for example flux-gate type sensors. Hall effect sensors may be combined in an integrated circuit with a range of other facilities, such as temperature compensation, calibration factor memory, digital output, non-ratiometric output, etc. Such facilities come at a cost and the designer when electing to use the more sophisticated Hall effect sensors will decide if the benefits merit the extra cost.

Also with respect to open loop and closed loop sensors, when selecting the material for the core, one should realize that the measurements of current to be made in electrolysis do not require a high bandwidth—the measurement being essentially that of direct current only. Hence bandwidth can be sacrificed to the benefit of other characteristics of the sensor. Low remanence magnetic material for the core is desirable. Low remanence material is generally more expensive than conventional silicon steel (such as is used for transformer laminations). Ferrite cores are also possible to be used but they are manufactured in specific shapes (for example E-cores and torroids) and it would be expensive to require a ferrite core manufacturer to tool-up for cores which have a specific three-dimensional shape. Remanence in the magnetic material can be mitigated by the well-known process of degaussing which some current sensor management integrated circuits offer as a built-in facility.

High accuracy results from measuring the current in each electrode at a location where it is concentrated in a point. Low cost of the magnetic circuit by choice of a magnetic material which optimises performance at dc rather than ac. Using the flexibility of the magnetic material chosen permits the magnetic material to be bent in three dimensions so as to allow the current sensor to be fitted around the contact point without cutting the busbar or electrode hanger bar.

An embodiment of the invention relates to the use of Hall effect sensors to measure currents in a multiplicity of adjacent electrodes within an electrolysis process.

Figure 9:
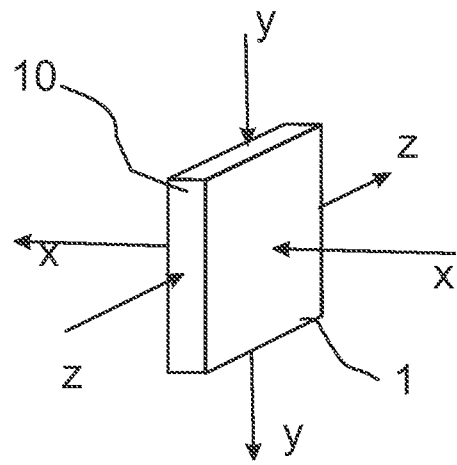
FIG. 9 is a schematic illustration of a Hall effect sensor.

FIG. 9 shows a typical Hall effect sensor 10. It is sensitive to magnetic flux passing through it in the x axis but not in the y or z axis. This can be used to discriminate between flux produced by current flowing in different planes.

Figure 10:
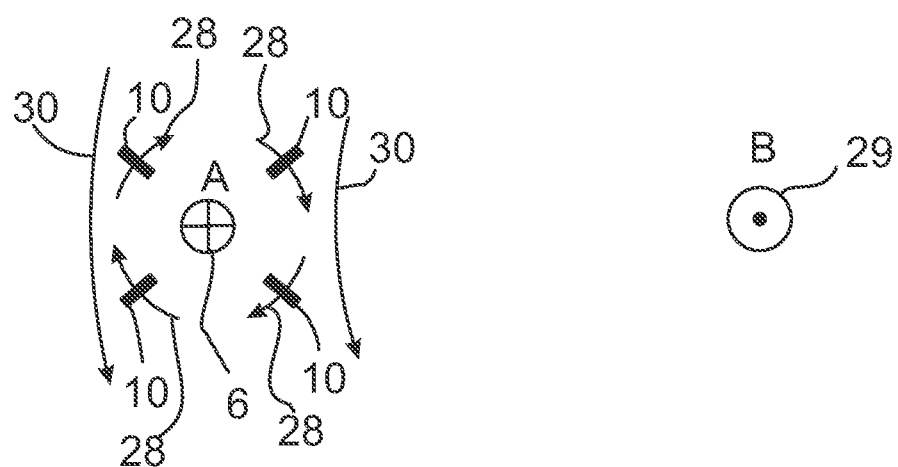
FIG. 10 shows four Hall effect sensors deployed around a busbar to hanger bar contact point at 90 degrees separation.

With reference to FIG. 10, in an embodiment of the invention an array of magnetic field sensors 10 is arranged around the contact point 6 substantially in the horizontal plane at the level of the contact point. FIG. 10 shows an array of Hall effect transducers 1 (top view) deployed around a current-carrying conductor which in this invention may be the contact point 6 (labeled A) between an electrode hanger bar and a busbar (not shown). The Hall effect sensors 10 are mounted with their edge (axis z, see FIG. 9) pointing towards the centre line of the contact point 6. The four Hall effect sensors 10 are equidistant from the contact point 6. Lines of magnetic flux 28 created by the current passing via the contact point 6 pass through the sensitive x axis of the Hall effect sensors 10. The output signals from the Hall effect sensors are added together (summed) either through analogue means or by being converted to digital data signals and added together in a microprocessor. The sum of these signals is a measure of the current flowing at the contact point 6 which is relatively insensitive to displacement of the contact point 6 within the array of Hall sensors 10. Additionally, if another conductor 29 (labeled B) is in the vicinity of the array of the Hall effect sensors 10, and generating magnetic flux in the same plane as that generated by conductor A, the sum of the sensor 10 outputs will be little affected by the magnetic flux 30 from conductor B. As FIG. 10 shows, flux lines 30 pass through pairs of sensors 10 in opposing directions and therefore the signal they generate in a pair of sensors sums to zero and the signal generated in the sum of all four of the sensors 10 will also sum to zero.

Figure 11:
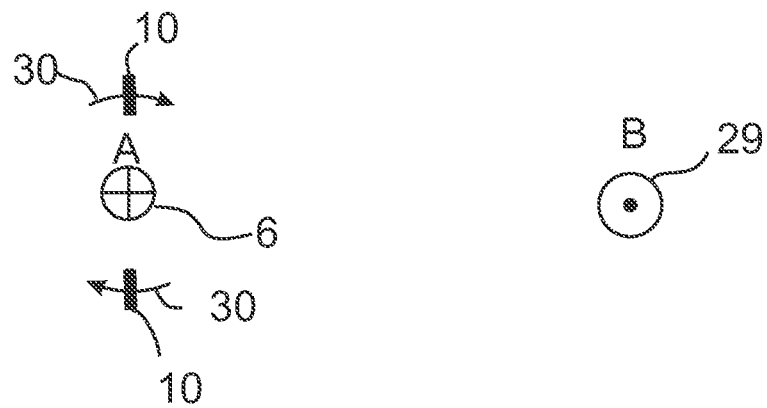
FIG. 11 shows two Hall effect sensors deployed around a busbar to hanger bar contact point at 180 degrees separation.

In the interests of economy, the number of sensors 10 can be reduced to two as shown in FIG. 11. However, the magnitude of the final signal will be halved. Also, the total signal (the sum of the two signals) will not be so insensitive to displacement of contact point in all directions. Also, as shown, the sensors 10 will be less insensitive to flux generated by conductor B but if the position of conductor B is rotated 90 degrees about conductor A, the array signal will become sensitive to flux from conductor B.

Figure 12:
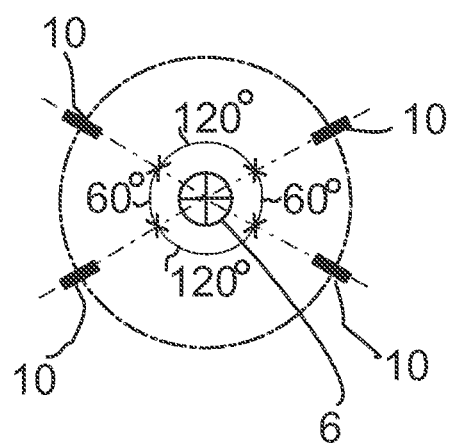
FIG. 12 shows four Hall effect sensors deployed around a contact point at 120 degrees, 60 degrees, 120 degrees and 60 degrees separation.

Similarly, if the angle between sensors in the array is changed to 120°, 60°, 120° and 60° as shown in FIG. 12, there will be similar loss of the array's capability to reject displacement of the conductor A with respect to the array and of the array's capability to reject the effect of flux from conductor B when B is in certain positions with respect to conductor A. However, where greatest accuracy of current measurement is not sought and it is convenient for constructional reasons to use a deployment as shown in FIG. 12, the loss of accuracy and unwanted signal rejection may be acceptable.

Figure 13:
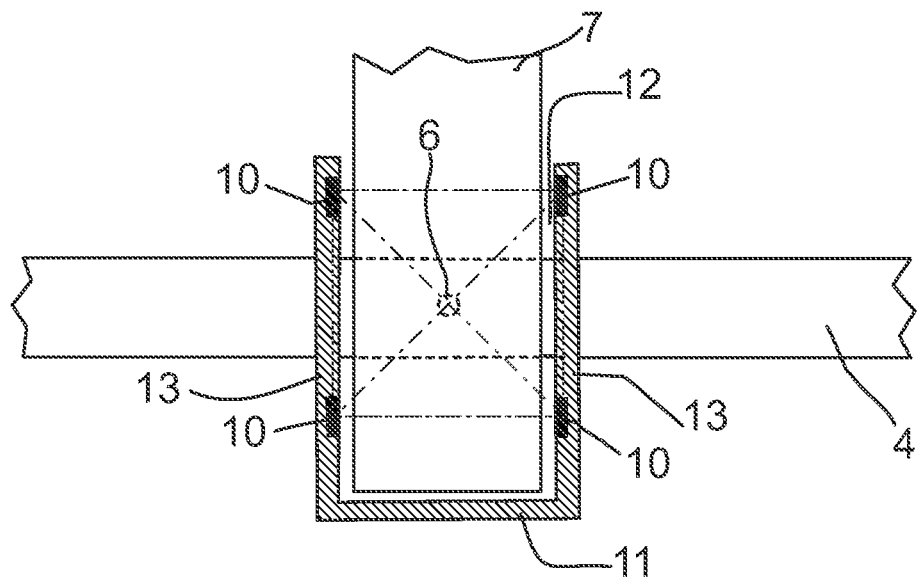
FIG. 13 shows a further embodiment in which the Hall effect sensors may be mounted in a non-optimal way for the convenience of assembly.

FIG. 13 shows a further example of placement of the magnetic field sensors 10. The arrangement comprises a frame unit 11 of insulating, non-magnetic material to hold the magnetic field sensors 10 in a predetermined position with respect to the contact point 6. The frame unit 11 comprises a notch 12 arranged to accommodate an electrode hanger bar 7 with a play. The notch 12 is defined between two walls 13 which are parallel and opposite and at a distance from each other. Two magnetic field sensors 10, which are spaced from each other, are attached to each of the walls 13. The sensors 10 are aligned with side walls 13 of a frame unit 11 which are aligned with the hanger bar 7 of an electrode which is perpendicular to the busbar 4.

As can be seen from FIG. 13, since the sensors 10 are aligned with walls 13 they are not mounted with their edge (axis z, see FIG. 9) pointing towards the centre line of the contact point 6 (as in FIG. 10). This placement of the sensors 10 is not ideal but may have advantages with respect to mounting.

Figure 14:
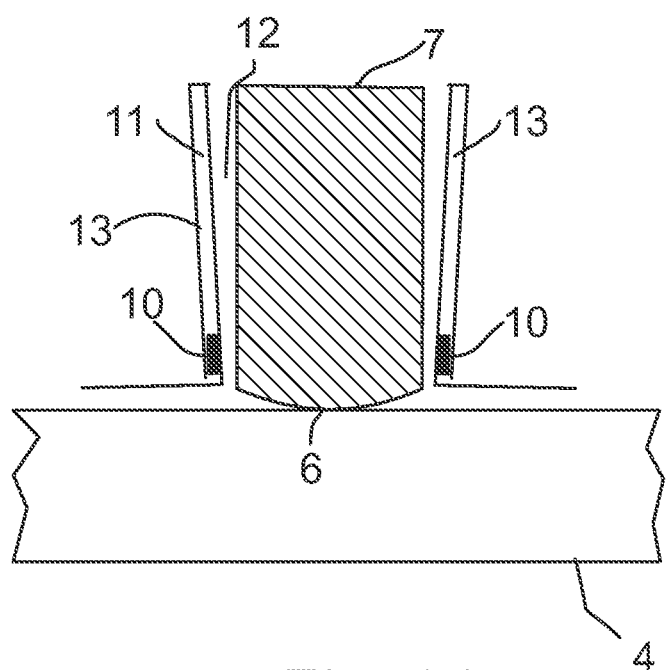
FIG. 14 shows how the Hall effect sensors may be mounted at an angle vertically to the ideal to facilitate mounting.

FIG. 14 shows a further example of placement of the magnetic field sensors 10. The sensors 10 are aligned vertically with the wall 13 of the frame unit 11 at a small angle to the vertical. A further non-ideality is occasioned by the possible elevation of the sensors 10 above the horizontal plane of the contact point 6 should it not be possible to mount them exactly along that plane for physical reasons.

A cathode or anode contact point 6 will require four Hall effect sensors 10 for best performance measurement of the current flowing through it.

Figure 15:
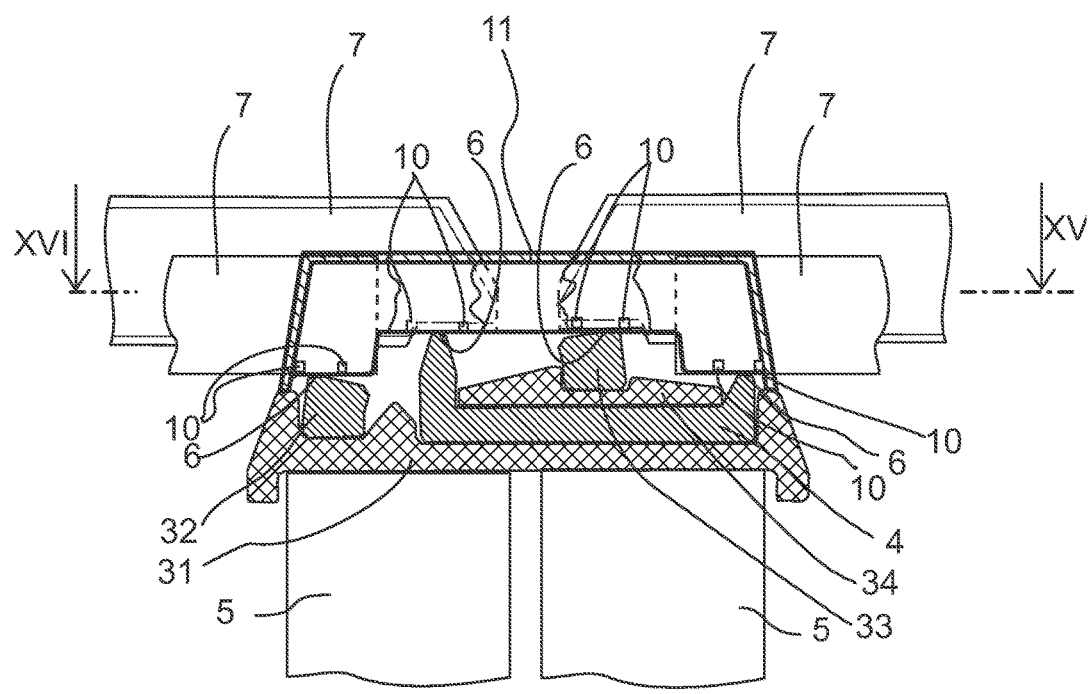
FIG. 15 shows a cross section of a double contact busbar system with cathode and anode hanger bars having their contact points to the conductors, and a frame unit having magnetic field sensors to detect the current passing through the contact points.
Figure 16:
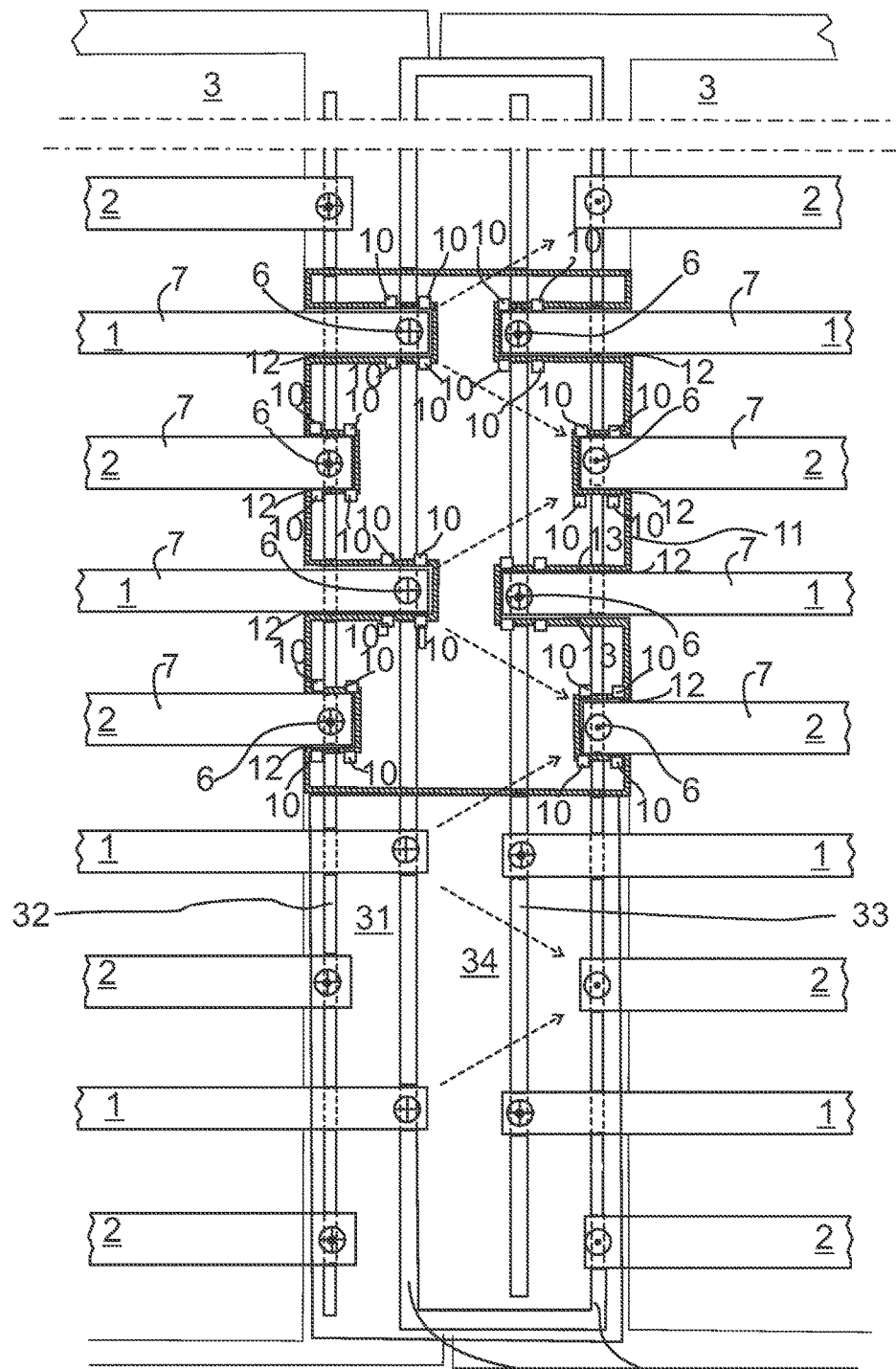
FIG. 16 shows in plan view the double contact busbar system of FIG. 16 wherein the frame unit covers four cathodes and anodes with four Hall sensors deployed around each busbar—hanger bar contact point.

FIGS. 15 and 16 show the arrangement of one embodiment of the invention adapted to be used in connection with a double-contact busbar system, trade name Outotec DoubleContact™, (also disclosed in U.S. Pat. No. 6,342,136 B1) together with hanger bars 7 of cathodes 1 and anodes 2 positioned on top of the busbar. The double-contact busbar system comprises a main intercell busbar 4, placed on a lower insulator 31, to conduct current from anodes 2 (on the left) to cathodes 1 (on the right). Further the system comprises a first equalizer busbar 32, placed on the lower insulator 31, for anode contacts and a second equalizer bar 33 for cathode contacts, said second equalizer 33 bar being placed on a second insulator 34 which is on the main intercell busbar 4. The double-contact busbar system aids the current distribution in the cell to be even across all electrodes. This system also provides the current with multiple paths to find the lowest resistance route between anode and cathode as the current goes from the busbar to the electroplating process.

FIG. 16 also illustrates the direction of the current at the contact points 6. In the contact points 6 of the anodes 2 to the main busbar 4 the current flows unidirectionally from the main busbar 4 to the anodes (out of the page). In the contact points 6 of the cathodes 1 to the main busbar 4 the current flows from the cathodes 1 to main busbar 4 unidirectionally (into the page). In the contact points 6 of the cathodes 1 to the first equalizer bar 33 the current flow is birectional. Likewise, in the contact points 6 of the anodes 2 to the second equalizer bar 32 the current flow is birectional.

FIGS. 15 and 16 show a frame unit 11 of insulating, non-magnetic material. The frame unit 11 holds the magnetic field sensors 10 in a predetermined position with respect to the contact point 6. The frame unit 11 comprises a plurality of magnetic field sensors 10 arranged to measure magnetic field from a plurality of contact points 6. The frame unit 11 comprises a plurality of notches 12, each of which is arranged to accommodate one end of an electrode hanger bar 7 with a play to allow installing of the frame by dropping it into position on the busbar without having to remove the electrodes and to allow lifting the electrodes without having to remove the frame. In this embodiment the frame unit 11 comprises notches 12 for four ends of hanger bars 7 of cathodes 1 and for four ends of hanger bars 7 of anodes 2. Each notch 12 is defined between two walls 13 which are parallel and opposite and at a distance from each other. A pair of magnetic field sensors 10, e.g. Hall effect sensors, which are spaced from each other, are attached to each of the walls 13.

In the embodiment of FIGS. 15 and 16 the current passing through the contact points 6 of both cathodes 1 and anodes 2 are monitored, though it is a matter of choice whether cathodes or anodes or both are monitored. The more contact points 6 that are monitored, the better will be the ability of the system to suppress inaccuracy in any particular current measurement due to the presence of currents in adjacent conductors.

The frame unit 11, as shown in FIG. 16, permits the anodes 2 and cathodes 1 to be lifted from the cell 3 without hindrance. Appropriate design of the frame unit 11 also allows the frame unit to be dropped into position on a working ER or EW system without interfering with production. Clearly this is an advantage where the current measuring system is retrofitted to an existing ER or EW plant. The frame units 11 may be constructed so heavy that they stay stationary on the busbar and are not lifted during harvesting even if the hanger bars frictionally contact the frame unit. In addition, or alternatively, the frame units can be equipped with quick release couplings to fix them to the cell wall or to the busbar.

Figure 17:
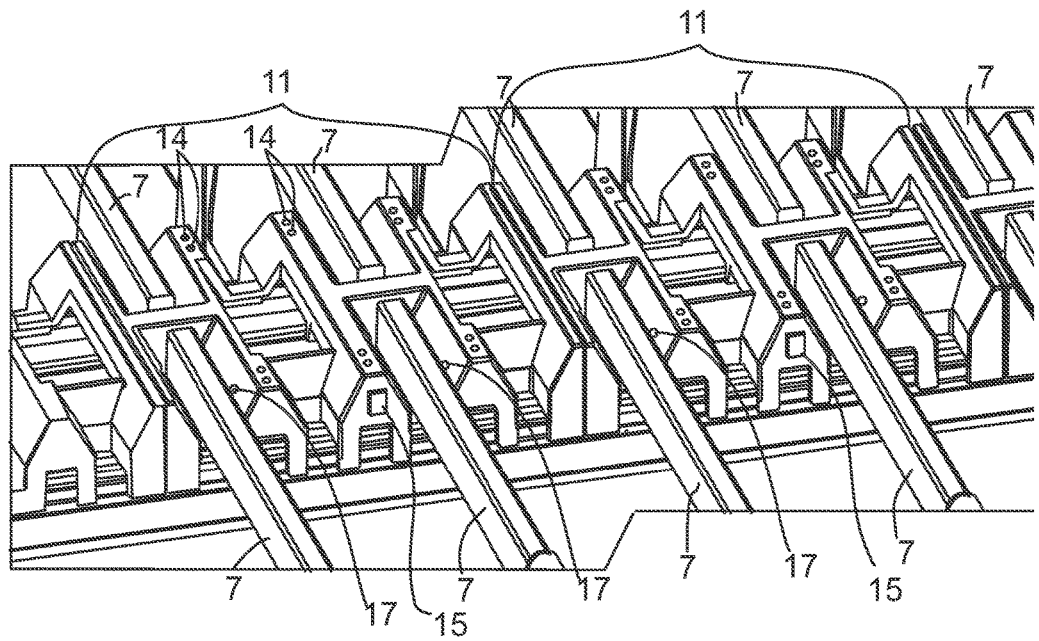
FIG. 17 shows in axonometric view an embodiment of the frame units which are designed so as to be able to be dropped onto a set of cathode and anode hanger bars while the ER or EW system is in operation and which allows unhindered lifting of anodes and cathodes.

FIG. 17 shows a row or queue of equal frame units 11, as described in connection with FIG. 16, placed on the intercell busbar. In FIG. 17 only hanger bars of cathodes 1 resting on the busbar are shown and hanger bars of the anodes are not shown. The frame units 11 are so designed that they may be dropped into position without interfering with production. Also they are so designed that the raising of cathodes and anodes is unhindered by the presence of the frame units 11. The frame unit 11 can comprise visual indicators 14 which are arranged to indicate which electrodes have a problem associated with them which requires attention. Where the frame unit 11 is endowed with visual indicators 14 (e.g. LEDs on its upper surface) it will be understood that these visual indicators 14 can provide information in ways other than being simply on or off. For example they may flash, at various rates, or change colour or employ a range of LEDs of various colours. Furthermore, a visual indicators 14 may be an infra-red light emitter so that information may be conveyed to a hand-held operator instrument or to a fixed infrared receiver. Visual indicators 14 may be LEDs located on the top of each frame unit 11 and can be used as a visual indicator of the position of anodes or cathodes that are in distress and need attention from an operator. The data transmitted back to the control room can also show an operator which anodes or cathodes need to be serviced.

Figure 18:
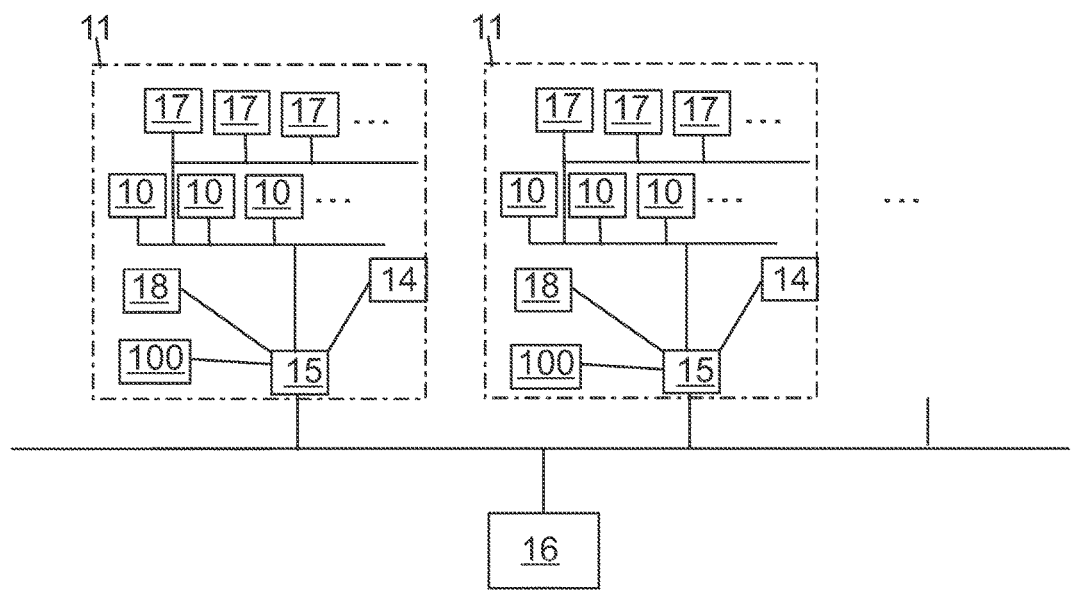
FIG. 18 is a block diagram of one embodiment of the arrangement of the invention.

Referring also to FIG. 18, the frame unit 11 may also comprise a microprocessor 15 for pre-analysis of the plurality of signals derived from the magnetic field sensors 10 so that only derived current measurement signals need to be transmitted to a central processing station 16. In some other embodiment, the microprocessor does not necessarily be physically fixed to the frame unit. The microprocessor can also be external and outside the frame unit. The microprocessor 15 may also be programmed to contain individual ID and location information. The visual indicators 14 are controlled by the microprocessor 15. The microprocessor within each frame unit 11 is given the capability to detect failure of a Hall effect sensor 10 and to reorganize its analysis of the remaining Hall sensor signal so that the frame unit 11 can continue to function, albeit in a slightly degraded manner, and at the same time, where possible, provide a warning signal to the central control room of the failure and degradation so that the frame unit may be replaced during a period of scheduled maintenance. The arrangement comprises a central processing unit 16 arranged to receive signals from the microprocessors 15 of the frame units 11.

An algorithm optionally within the operating programme of the microprocessor contained within the frame unit can be arranged to create a record of each anode and/or cathode current against time and analyses said record to look for the profile of a short circuit in the process of developing.

The frame unit 11 may also comprise temperature sensors 17 arranged to measure the temperature of the electrode hanger bars 7, bus bars 4 or the frame unit 11. Temperature sensors 17 can be connected to the microprocessor 15 of the frame unit and hence also communicate with the central control facility 16. The temperature sensors 17 are preferentially located close to the electrode hanger bars 7. The hanger bars 7 are the most likely source of heating of the frame unit 11. This heating could damage the Hall effect sensors 10. Hence an early warning of rising temperature will enable an operator to take corrective action and avoid damage to the Hall sensors and other electronic components within the frame unit. Additionally hot hanger bars are an indication of a short circuit between electrodes. Cold hanger bars could be an indication of an open circuit. Hence the temperature sensors are another source of information about the condition of the electrolysis cell. The Hall effect sensors and the temperature sensors may therefore cooperate to provide plant operators with a warning of actual or impending problems. Optionally, the signals from the Hall effect sensors and the temperature sensors may be analysed by the microprocessor in the frame unit to provide a simple warning of a problem at that location to the control room or via a visual indicator mounts on the frame unit. The frame unit may operate even if no current sensor is in operation so that it depends entirely upon temperature detection. Some characteristics of the Hall effect sensors are temperature dependent. The temperature readings sent to the microprocessor can therefore be used to correct for temperature the signals arriving from the Hall effect sensors. Thermistors, thermocouples, digital sensors or infrared sensors may all be used as temperature sensors.

Further, the frame unit 11 may comprise an electric energy storage 18 which may be chargeable by energy harvesting from the ambient or externally via normal power supply. A typical Hall effect sensor will draw approximately 10 mA in operation. If a frame unit should encompass four cathodes and four anodes, each surrounded by four Hall effect sensors, the total number of Hall effect sensors employed will be 32. The total current drawn by the Hall effect sensors if all are operated continuously will be 320 mA. This may be inconveniently large. Each Hall effect sensor or array of Hall effect sensors may therefore be connected to its power supply by an electronic switch (for example, a MOSFET) which is under the control of the microprocessor in the frame unit. Hence only those Hall sensors for which a reading is required at any time are activated by the microprocessor.

Since electrolysis varies with time only slowly, readings of the current (and any other measurements) need only be taken at large intervals of time. Furthermore, readings can be obtained from the Hall sensors in fractions of a second. The microprocessor can be arranged to spend most of the time in sleep mode using only a tiny amount of power with all other electronics in the frame unit turned off. Hence the average power consumption of the electronics contained within the frame unit can be very low. The frame unit can spend nearly all the time in hibernation using only a few µW of power. If there is an energy storage unit within the frame units (for example a suitably sized capacitor or rechargeable battery) this can be trickle charged from a low power source or via a 4normal power supply. It may be possible to obtain this trickle charge by energy harvesting. There are a number of ways this can be achieved (e.g. ripple current, photovoltaic source, thermal pile or Peltier generator using the heat from the electrolysis tank). In addition this stored energy may also be used to transmit the data obtained wirelessly if desired by activating a radio transmitter for a very short time (typically a fraction of a second).

A further embodiment may also be that on the base of the frame unit, spring contacts which press against the busbar conducting elements. The purpose of these contacts is twofold: they permit power for the frame unit electronics to be collected from the busbars elements, and they enable voltage measurements to be made on the busbar elements. More contacts can be provided than is strictly necessary for operation so that there is some redundancy which is useful if contamination prevents any one spring contact from making a good connection with the busbar element. The microprocessor can monitor the state of each spring contact and advise the operator if maintenance of the frame unit is required.

Frame units 11 may also be daisy-chained electrically with power and signaling wires connected from unit to unit using plugs and sockets. Instead of using a plugs-and-socket daisy-chain system to connect frame units, it is also possible to run cable, such as a twisted pair of wires, along the side of each tank and couple power into each frame unit in a non-contact fashion while coupling data again into and out of that cabling in a non-contact fashion. It is also possible to arrange an inductive coupling between frame units. The first frame unit can be powered with hard wiring and the power can then pass wirelessly via the inductive couplings down a daisychain of the frame units.

Within the frame units 11 are stabilised power supplies which give a suitable accurate voltage output to permit the use of ratiometric Hall effect sensors 10 within the frame unit. The microprocessor 15 within the unit can be programmed with a start-up routine which allows compensation for offset voltages from the Hall effect sensors. The microprocessor 15 can be switched on before fitting the unit 11 to the ER or EW plant to accomplish this.

During assembly, calibration of the Hall effect sensors 10 may be carried out to enhance accuracy. This will require the use of a calibration apparatus capable of generating a known set of currents in a suitable dummy busbar and hanger bar structure. The microprocessor can thereby acquire and remember a calibration factor for each Hall effect sensor.

Typically a calibrating apparatus will be used to test and calibrate the Hall sensors used in the frame unit. This calibrating unit would typically have a set of hanger bars resting on bus bars in a form which emulates the structure found in the electrolysis cell. Current sources are applied to this rig which are capable of applying a pattern of currents through the various conductors during calibration in a continuous, pulsed or varying manner. In coordination with this current pattern (which is predetermined or conveyed to the microprocessor of the frame unit) measurements are taken by the microprocessor of the Hall effect sensor readings at appropriate moments in time. These readings are used to calibrate the current readings produced by the microprocessor.

A typical calibration procedure might be as follows. Assuming that all the conductors (or contact points) are surrounded by an array of four Hall effect sensors, as previously described. A first test would be to apply a current to one conductor or contact point only. Readings would be taken from the four Hall effect sensors surrounding this conductor or contact point. From these readings a measure of the current in the conductor or contact point would be obtained. Additionally and simultaneously, readings would be obtained from all other Hall effect sensors in the frame unit. This process is then repeated for all conductors or contact points which the frame unit addresses and the currents in which it is responsible for reporting. Hence, when the current in a particular conductor or contact point is being measured, the microprocessor can correct the readings in the array of Hall effect sensors surrounding that array for the effects of any currents which may be flowing in any of the other conductors or contact points. Hence the calibration and learning process which the microprocessor goes through during calibration, forms an essential role in achieving high accuracy current measurements and this methodology and associated algorithm is a further aspect of the invention.

From each frame unit 11 current information can be transmitted via the data link to a control room or monitor screen to allow the current measurements to be observed, recorded and analysed. The current data link for each tank may be terminated in a frame unit already employed for returning current information to a control room so that the already established data links may be used for transmission of data from the frame units.

In summary, the present invention provides several advantages. High accuracy of the measurement results from measuring the current in each electrode at a location where it is concentrated in a point, i.e. at the contact point. The use of a plurality of magnetic field sensors to measure each current permits good signal strength while giving good immunity to unwanted signal intrusion. The inclusion of a microprocessor in unit frames and its ability to remember location with an ID and calibration factors for each Hall effect sensor allows low cost basic Hall sensors to be employed while achieving good accuracy for the unit. The presence of a microprocessor in the unit frame enables analysis of the Hall effect sensor signals within the frame unit permitting visual signaling to operators to be located on the frame unit. Appropriate design of the frame units permit the units to be installed whilst the ER or EW plant is operating. The frame units allow operation, including raising and lowering of electrodes to proceed unhindered.

While Hall effect sensors and temperature sensors have been disclosed, the frame unit may contain also other sensors or measuring equipment in addition to those described here and its measurement facilities are not limited merely to current and temperature.

While the present inventions have been described in connection with a number of exemplary embodiments, and implementations, the present inventions are not so limited, but rather cover various modifications, and equivalent arrangements, which fall within the purview of prospective claims.

The invention claimed is:

1. A method of measuring electric current flowing in an individual electrode in an electrolysis system comprising a plurality of interleaved electrodes, cathode electrodes and anode electrodes, arranged in an electrolysis cell and immersed in electrolyte, said electrolysis system having a busbar disposed on a separating cell wall between each of two adjacent cells to conduct electric current to the electrodes via a contact point between the busbar and a hanger bar of the electrode, and in which method the electric current of each electrode is measured by measuring the magnetic field induced by said current, wherein the magnetic field is sensed substantially at the level of the contact point, wherein the magnetic field is sensed with a magnetic circuit being arranged to encircle the contact point substantially in a horizontal plane at the level of the contact point.

2. The method according to claim 1, wherein the magnetic circuit is an open loop current sensor.

3. The method according to claim 1, wherein the magnetic circuit is a closed loop current sensor.

4. The method according to claim 1, wherein the magnetic circuit comprises a core of magnetic material formed as a first ring surrounding the contact point, said ring being placed in recesses formed in the busbar.

5. The method according to claim 1, wherein the magnetic circuit is a core of magnetic material formed as a second ring surrounding the contact point and being bent, folded or formed in two or three dimensions to fit over the busbar.

6. A method of measuring electric current flowing in an individual electrode in an electrolysis system comprising a plurality of interleaved electrodes, cathode electrodes and anode electrodes, arranged in an electrolysis cell and immersed in electrolyte, said electrolysis system having a busbar disposed on a separating cell wall between each of two adjacent cells to conduct electric current to the electrodes via a contact point between the busbar and a hanger bar of the electrode, and in which method the electric current of each electrode is measured by measuring the magnetic field induced by said current, wherein the magnetic field is sensed substantially at the level of the contact point, wherein the magnetic field is sensed with a magnetic field sensor arranged in the vicinity of the contact point and in the horizontal plane, and further, wherein the magnetic field is sensed with an array of magnetic field sensors arranged in three dimensional space around the contact point substantially in the plane of the contact point at an angle in the range 0 to 75° with respect to horizontal.

7. A method of measuring electric current flowing in an individual electrode in an electrolysis system comprising a plurality of interleaved electrodes, cathode electrodes and anode electrodes, arranged in an electrolysis cell and immersed in electrolyte, said electrolysis system having a busbar disposed on a separating cell wall between each of two adjacent cells to conduct electric current to the electrodes via a contact point between the busbar and a hanger bar of the electrode, and in which method the electric current of each electrode is measured by measuring the magnetic field induced by said current, wherein the magnetic field is sensed substantially at the level of the contact point, wherein the magnetic field is sensed with a magnetic field sensor arranged in the vicinity of the contact point and in the horizontal plane, and further wherein a frame unit of insulating, non-magnetic material is arranged to hold the magnetic field sensors in a predetermined position in three dimensional space with respect to the contact point.

8. A current measuring arrangement for measuring electric current flowing in an individual electrode in an electrolysis system comprising a plurality of interleaved electrodes, cathode electrodes and anode electrodes, arranged in an electrolysis cell and immersed in electrolyte, said electrolysis system having a busbar disposed on a separating cell wall between each of two adjacent cells to conduct electric current to the electrodes via a contact point between the busbar and a hanger bar of the electrode, and the current sensing arrangement comprises a magnetic field sensing means for measuring the magnetic field induced by said current, wherein the magnetic field sensing means are arranged to sense the magnetic field substantially at the level of the contact point, wherein the magnetic field sensing means comprise a magnetic circuit arranged to encircle the contact point substantially in the horizontal plane which is at the level of the contact point.

9. The arrangement according to claim 8, wherein the magnetic circuit is an open loop current sensor.

10. The arrangement according to claim 8, wherein the magnetic circuit is a closed loop current sensor.

11. The arrangement according to claim 8, characterized in the magnetic circuit comprises a core of magnetic material formed as a first ring surrounding the contact point, said ring being placed in recesses formed in the busbar.

12. The arrangement according to claim 8, wherein the magnetic circuit is a core of magnetic material formed as a second ring surrounding the contact point and being bent or folded in two or three dimensions over the busbar.

13. The arrangement according to claim 12, wherein the magnetic field sensing means comprises a magnetic field sensor arranged in the vicinity of the contact point.

14. The arrangement according to claim 13, wherein the arrangement comprises an array of magnetic field sensors arranged around the contact point substantially in a plane of the contact point.

15. The arrangement according to claim 13, wherein the array of magnetic field sensors is arranged in a three dimensional space around the contact point substantially in the plane of the contact point at an angle in the range 0 to 75° with respect to horizontal.

16. The arrangement according to claim 13, wherein the arrangement comprises a frame unit of insulating, non-magnetic material to hold the magnetic field sensors in a predetermined position with respect to the contact point.

17. A current measuring arrangement for measuring electric current flowing in an individual electrode in an electrolysis system comprising a plurality of interleaved electrodes, cathode electrodes and anode electrodes, arranged in an electrolysis cell and immersed in electrolyte, said electrolysis system having a busbar disposed on a separating cell wall between each of two adjacent cells to conduct electric current to the electrodes via a contact point between the busbar and a hanger bar of the electrode, and in which method the electric current of each electrode is measured by measuring the magnetic field induced by said current, wherein the magnetic field is sensed substantially at the level of the contact point, wherein the magnetic field is sensed with a magnetic field sensor arranged in the vicinity of the contact point and in the horizontal plane, and further wherein the magnetic field is sensed with an array of magnetic field sensors arranged in three dimensional space around the contact point substantially in the plane of the contact point at an angle in the range 0 to 75° with respect to horizontal.

* * * * *

UNITED STATES PATENT AND TRADEMARK OFFICE
CERTIFICATE OF CORRECTION

PATENT NO.         : 9,695,520 B2
APPLICATION NO.    : 14/769437
DATED              : July 4, 2017
INVENTOR(S)        : Duncan Grant It is certified that error appears in the above-identified patent and that said Letters Patent is hereby corrected as shown below:

In the Specification

Column 12, Line 16 "...to displacement of contact point in all directions." should be -- to displacement of contact point 6 in all directions. --

Column 13, Line 16 "...main busbar 4 to the anodes (out of the page)." should be -- main busbar 4 to the anodes 2 (out of the page). --

Column 13, Line 65 "...In FIG. 17 only hanger bars of cathodes 1..." should be -- In FIG. 17 only hanger bars 7 of cathodes 1 --

Column 14, Line 12 "...Furthermore, a visual indicators 14..." should be -- Furthermore, a visual indicator 14 --

Signed and Sealed this
Twenty-second Day of August, 2017

Joseph Matal
*Performing the Functions and Duties of the
Under Secretary of Commerce for Intellectual Property and
Director of the United States Patent and Trademark Office*